(12) United States Patent
Casey

(10) Patent No.: US 6,509,625 B1
(45) Date of Patent: Jan. 21, 2003

(54) GUARD STRUCTURE FOR BIPOLAR SEMICONDUCTOR DEVICE

(75) Inventor: David Neil Casey, Lancashire (GB)

(73) Assignee: Zetex PLC (GB)

( * ) Notice: Subject to any disclaimer, the term of this patent is extended or adjusted under 35 U.S.C. 154(b) by 0 days.

(21) Appl. No.: 09/445,110

(22) PCT Filed: Apr. 1, 1999

(86) PCT No.: PCT/GB99/00856
§ 371 (c)(1),
(2), (4) Date: May 9, 2001

(87) PCT Pub. No.: WO99/52150
PCT Pub. Date: Oct. 14, 1999

(30) Foreign Application Priority Data

Apr. 3, 1998 (GB) .............................................. 9807115
Jun. 24, 1998 (GB) .............................................. 9813508

(51) Int. Cl.⁷ .............................................. H01L 29/70
(52) U.S. Cl. ..................... 257/554; 257/546; 257/552; 257/588; 257/590
(58) Field of Search ................................. 257/546, 554, 257/552, 559, 587, 588, 590

(56) References Cited

U.S. PATENT DOCUMENTS

| 5,580,798 A | * | 12/1996 | Grubisich ..................... 438/358 |
| 5,723,890 A | * | 3/1998 | Fujihira et al. ............... 257/339 |
| 5,847,440 A | * | 12/1998 | Yamamoto ..................... 257/525 |
| 5,869,406 A | * | 2/1999 | Su et al. ......................... 438/789 |
| 5,889,315 A | * | 3/1999 | Farrenkopf et al. .......... 257/552 |
| 5,960,286 A | * | 9/1999 | Minami et al. .............. 438/275 |
| 6,190,911 B1 | * | 5/2001 | Gofuku ......................... 435/365 |

* cited by examiner

Primary Examiner—George C. Eckert, II
(74) Attorney, Agent, or Firm—Skjerven Morrill LLP

(57) ABSTRACT

A guard ring structure formed around the periphery of a bipolar semiconductor device. A guard region (11) is formed in a substrate (1) of the device so as to extend adjacent a peripheral portion of the device. An insulating layer (3) is formed on the substrate between the peripheral portion of the device and the guard region (11). A polysilicon layer (13) is formed on the insulating layer (3) and covered with a layer of densified dielectic (14). Electrical interconnections are provided between the polysilicon layer (13) and the guard region (11) at spaced apart portions of the device where the guard structure does not need to be protected by the densified dielectric.

8 Claims, 7 Drawing Sheets

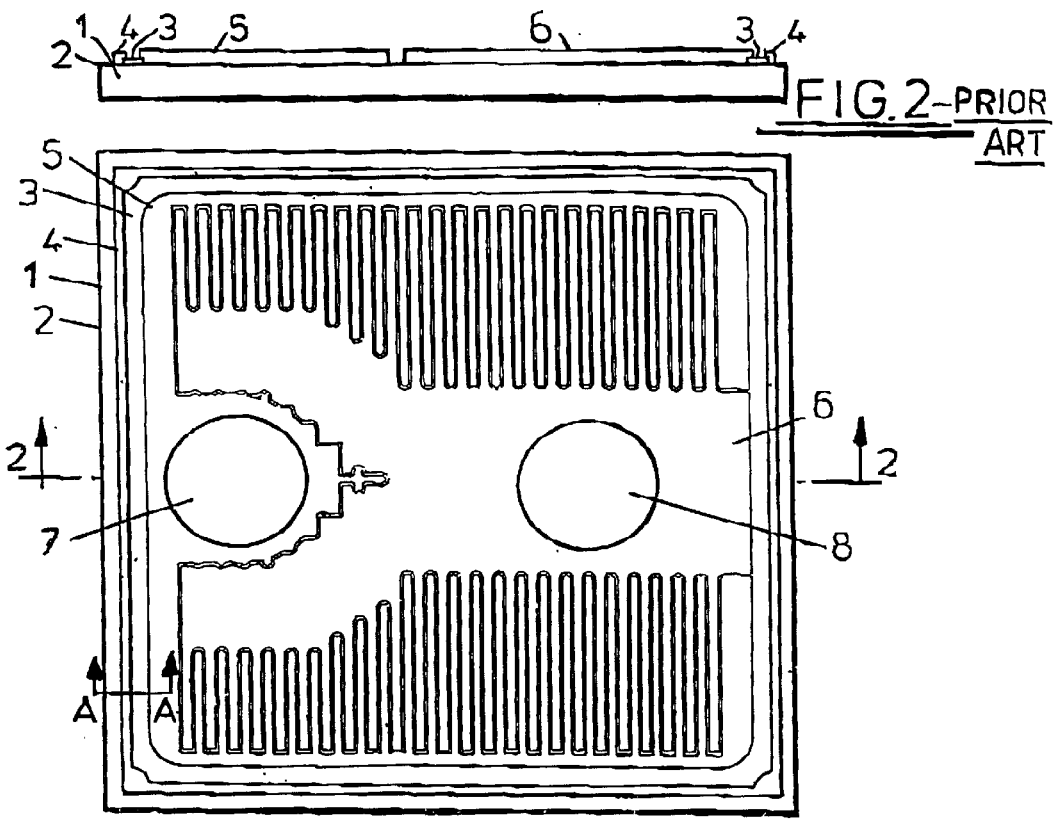
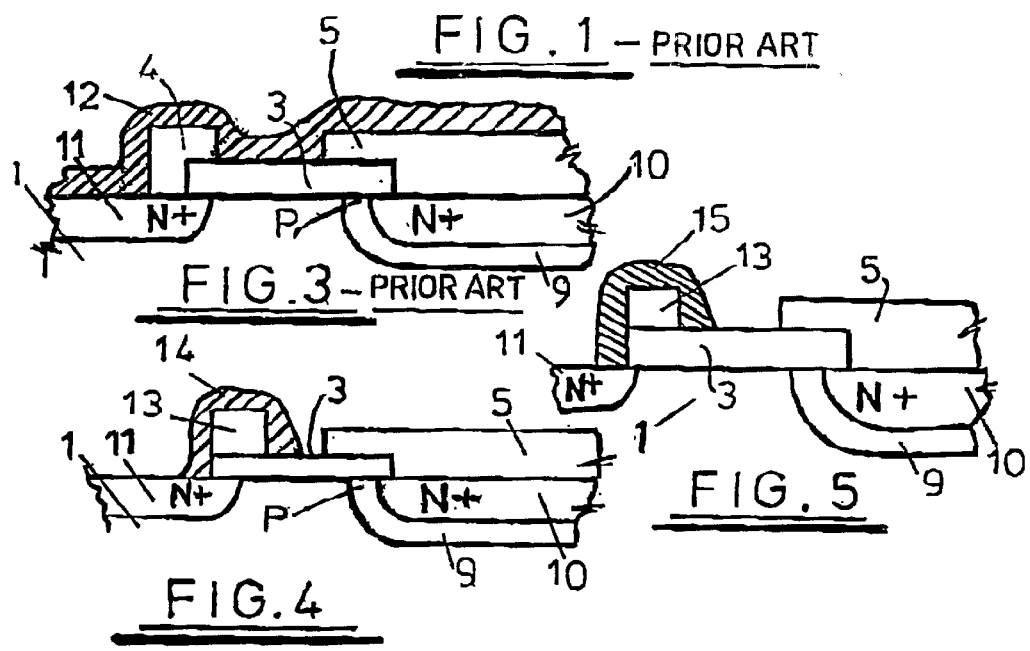

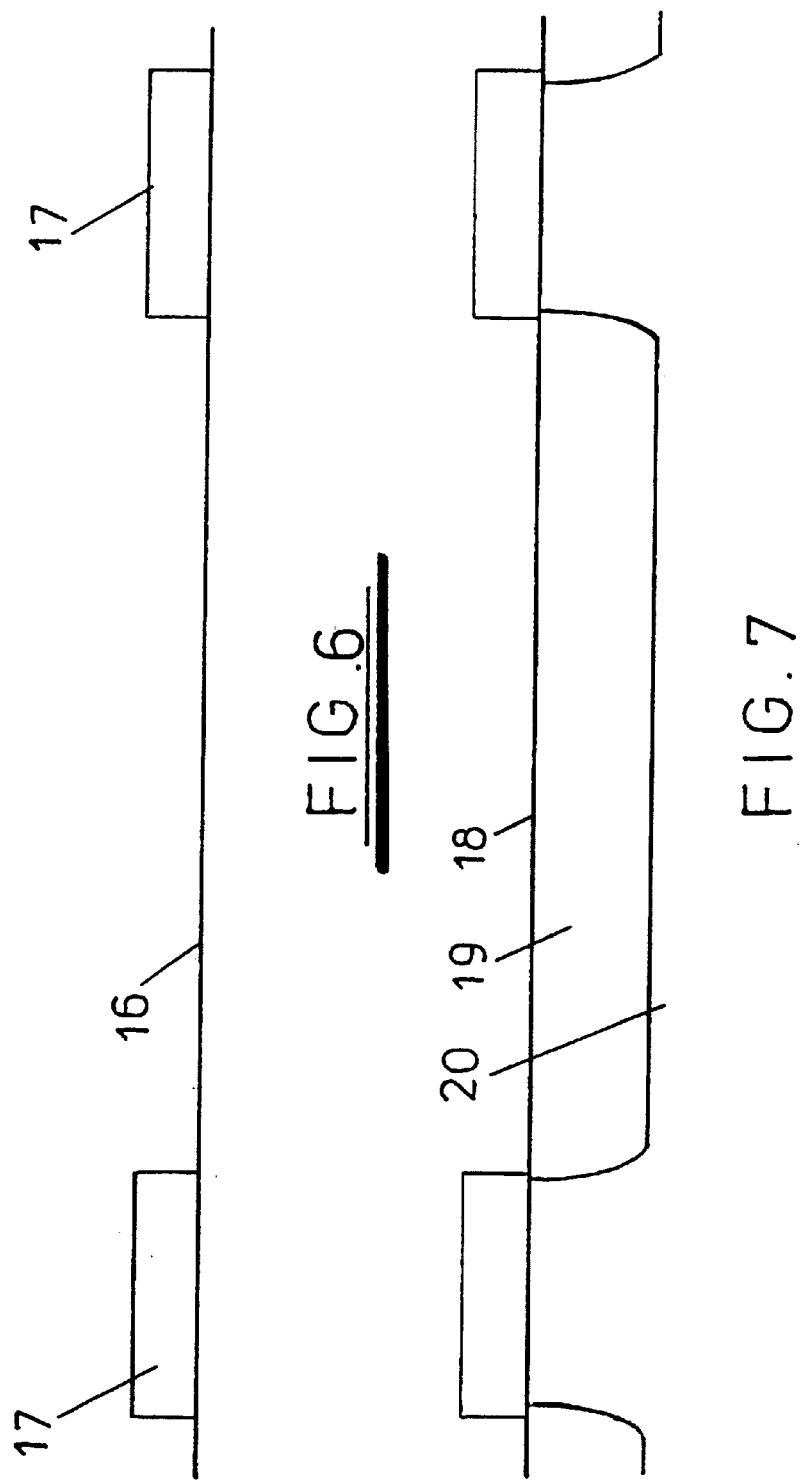

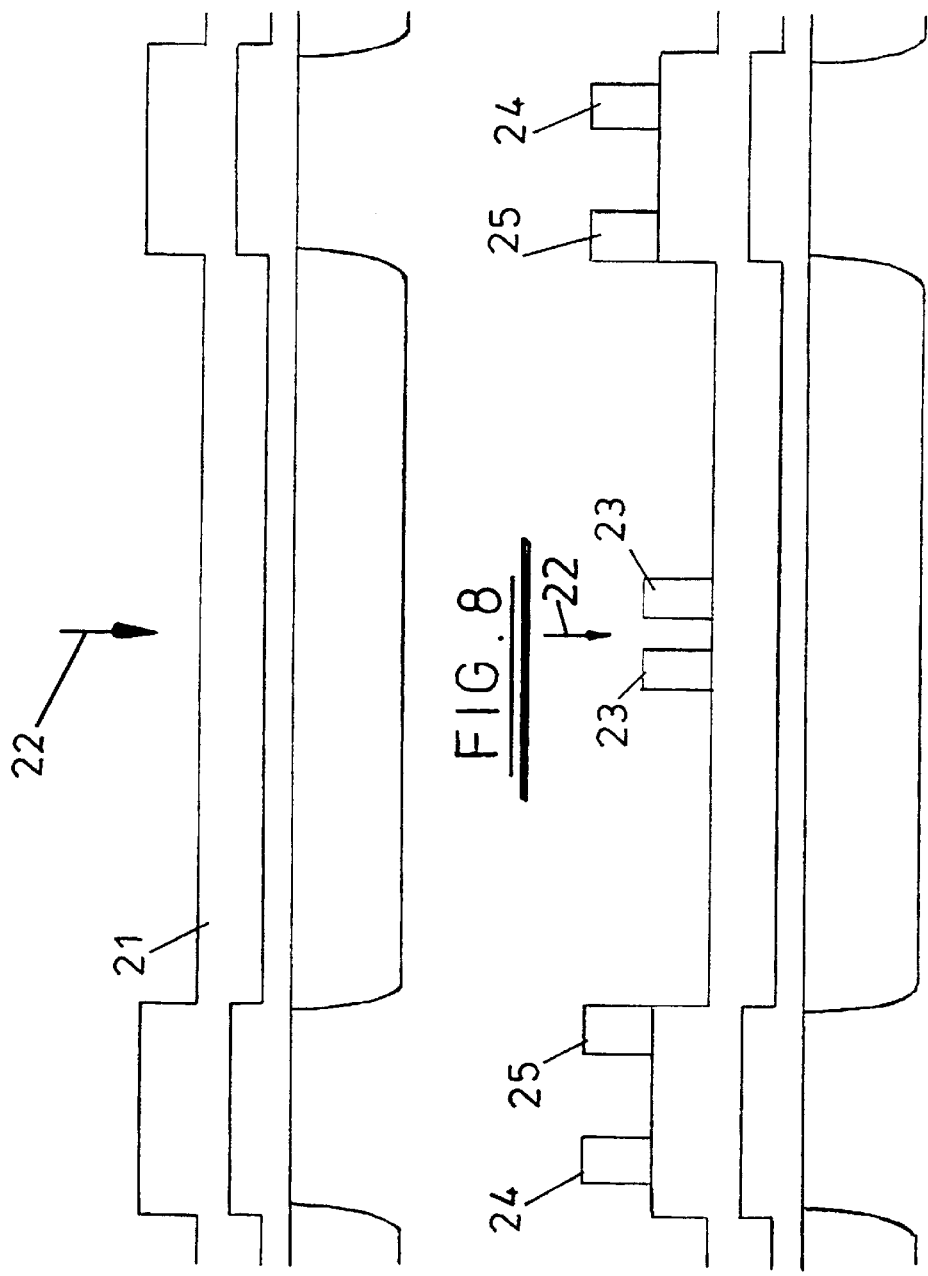

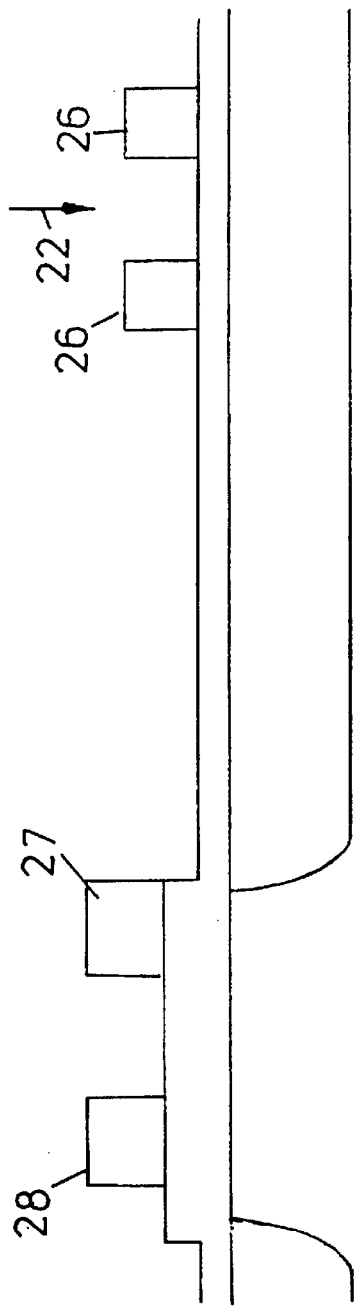
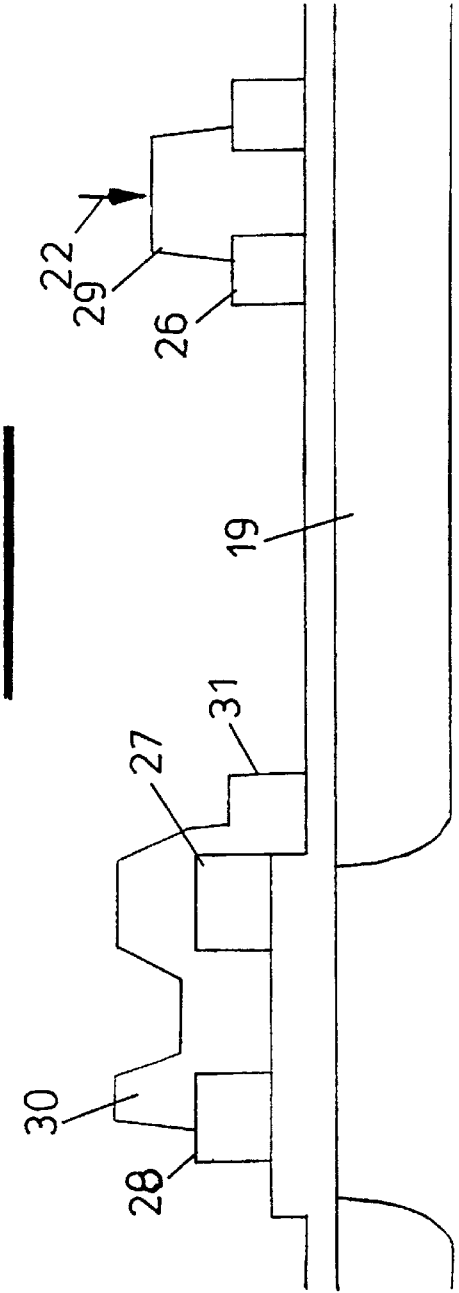

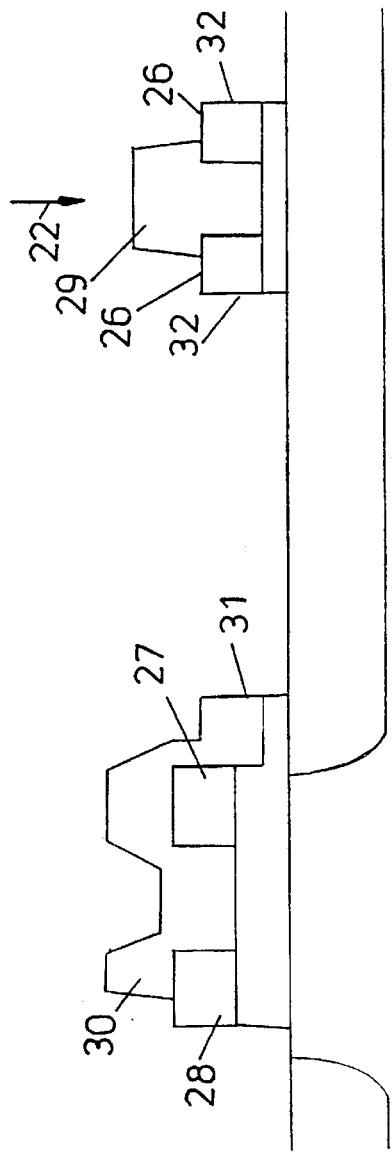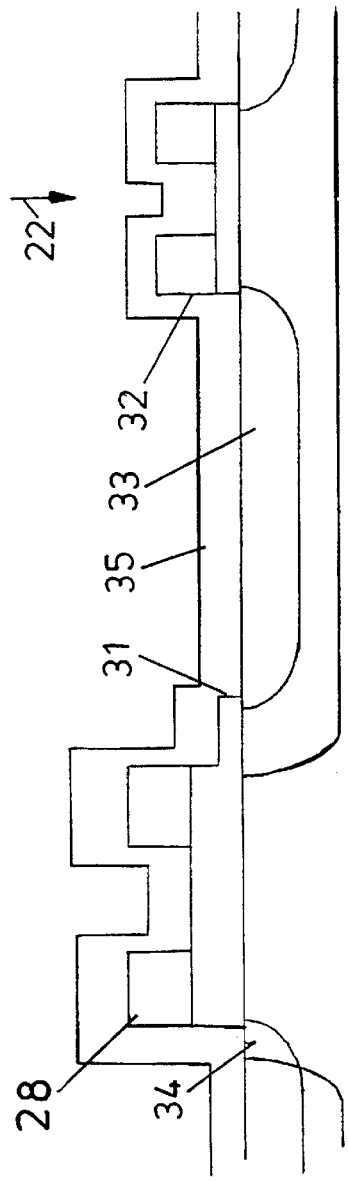

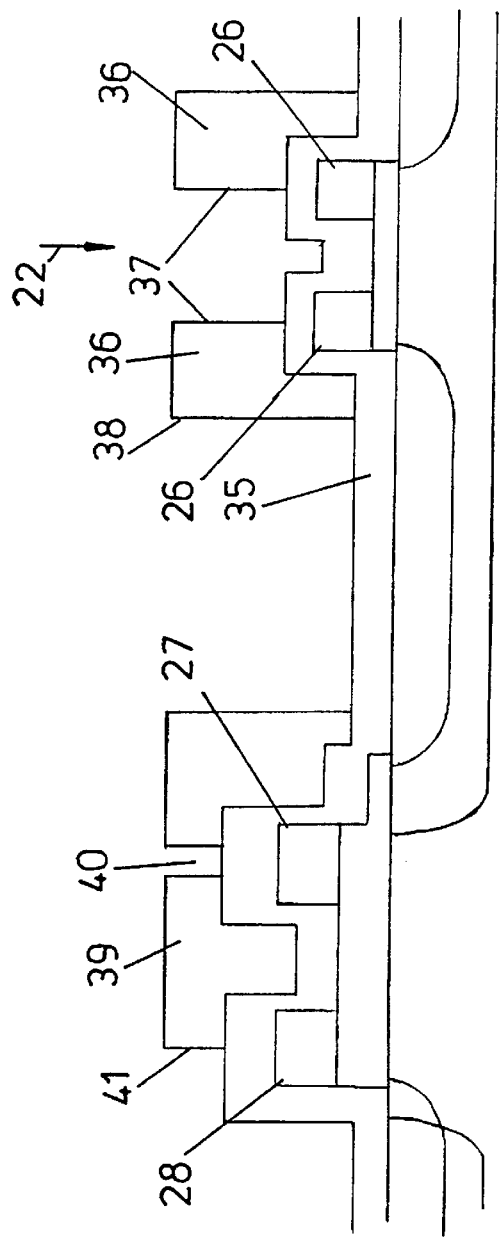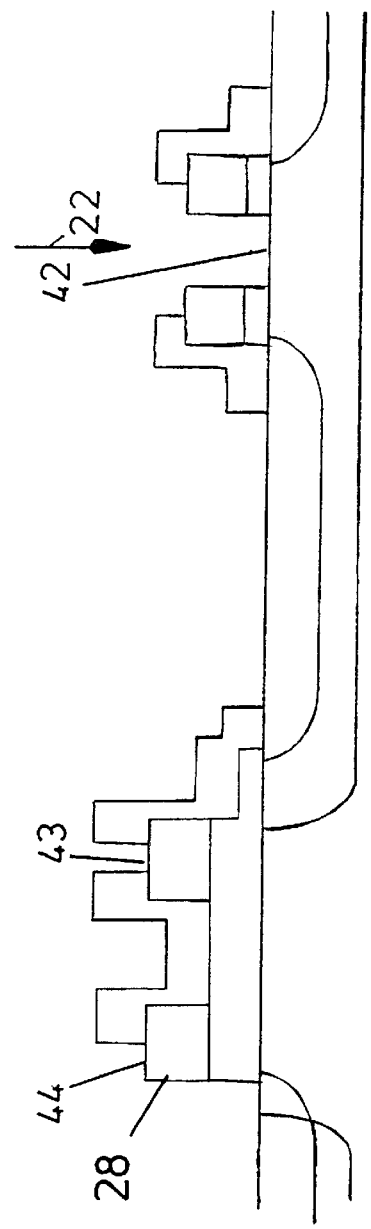

GUARD STRUCTURE FOR BIPOLAR SEMICONDUCTOR DEVICE

This invention relates to a guard ring structure for a bipolar semiconductor device.

Guard structures, generally in the form of rings, are used to control potential gradients at the periphery of bipolar semiconductor devices. In a conventional guard ring, a metal equipotential ring extends around the periphery of the device. The equipotential ring is typically formed of aluminium that is deposited on a silicon oxide insulator which overlies an implanted or diffused guard region formed in a substrate of the device. In a bipolar device, an emitter guard region is diffused or implanted into the substrate at the outer edge of the device and is electrically connected to the equipotential ring to form the guard ring. The guard ring is laterally spaced from the active region of the semiconductor surface.

The guard ring is used to control potential gradients at the periphery of the device.

An electrical connection to a bipolar semiconductor device incorporating a guard ring may be made by depositing a bond on the surface of the semiconductor. The bond can, however, often be misaligned and can overlie the guard ring. This can create an electrical connection between the guard ring and the bond, causing a permanent or intermittent short circuit which will lead to device failure or reliability problems.

The equipotential ring is sometimes covered with a layer of dielectric compound. However, as the equipotential ring is typically of aluminium, which can only withstand temperatures up to approximately 500° C., the dielectric layer cannot be densified, as this would require temperatures of the order of 800–900° C. The dielectric layer thus remains relatively soft and fragile and is easily damaged. The dielectric layer does not therefore provide very good protection against short circuiting as a result of bond misalignment.

It is an object of the present invention to obviate or mitigate such problems with the prior art.

According to the present invention there is provided a bipolar semiconductor device guard structure, comprising a guard region formed in a substrate of the device and extending adjacent a peripheral portion of the device, an insulating layer formed on the substrate between the peripheral portion of the device and the guard region, a polysilicon layer formed on the insulating layer, a layer of densified dielectric covering the polysilicon layer, and at least one electrical interconnection between the polysilicon layer and the guard region.

Thus, use of polysilicon rather than aluminium makes it possible to protect the guard ring structure with a densified dielectric. The risk of short circuiting between the active surface of the device and the guard ring is thus greatly reduced.

The polysilicon layer may overlap an outer edge of the insulating layer. The guard region may be diffused or implanted into the substrate. The polysilicon may define all or part of a closed ring of conductive material of for example rectangular shape, and four electrical interconnections may be provided, one at each corner of the rectangular shape.

Embodiments of the present invention will now be described, by way of example, with reference to the accompanying drawings, in which:

FIG. 1 is a plan view of a conventional semiconductor device showing the layout of a guard structure and contact pad structures;

FIG. 2 is a sectional view on the line 2—2 of FIG. 1 showing the structures appearing in plan in FIG. 1;

FIG. 3 is a section on the line A—A of FIG. 1 after the addition to the guard ring structure of an undensified insulating layer.

FIG. 4 is a view similar to that of FIG. 3 but showing an embodiment of the present invention in which a polysilicon guard ring structure is covered with a densified insulating layer;

Figure 16:
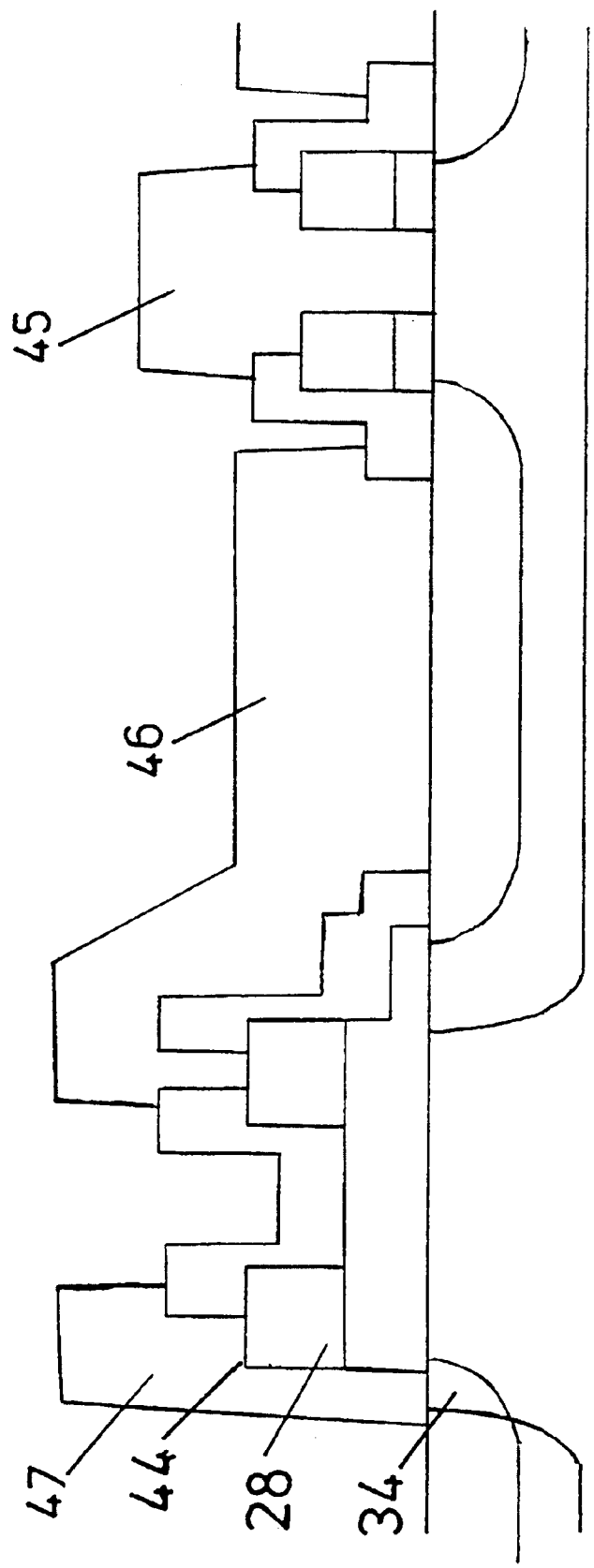

FIG. 5 is a view of the guard ring structure shown in FIG. 4 but in a section of the guard ring structure where the polysilicon is covered with an electrically conductive layer rather than a densified insulating layer; and FIGS. 6 to 16 illustrate successive steps in a process for forming a device incorporating a guard ring structure which is different in detail from but of the same type as that illustrated in general terms in FIGS. 1 to 5.

Referring to FIGS. 1 and 2, the illustrated semiconductor device comprises an n-type substrate 1 having an outer edge 2, an oxide layer 3 formed on the upper surface of the substrate, an aluminium equipotential ring 4 overlapping an outer edge of the oxide layer 3, a first metal layer 5, and a second metal layer 6. The metal layers 5 and 6 define an interdigitated structure, the metal layer 5 overlapping the inner edge of the oxide layer 3 around three sides of the substrate and approximately two thirds of the fourth side, and the contact layer 6 overlapping the inner edge of the oxide layer 3 along approximately one third of that fourth side. The two metal layers define relatively large unbroken areas, the circles 7 and 8 representing bond pad areas for connecting the device to external components.

Referring to FIG. 3, this illustrates the structure of the device in the region of the guard ring at the position indicated by line A—A in FIG. 1. The upper surface of the substrate has diffused into it a p-type region 9 which will form the base of a bipolar transistor and an n-type region 10 which will form the emitter of the bipolar transistor. The emitter regions 10 are distributed across the surface of the device so as to register with the areas of the device beneath the contact layer 6. In addition an n-type surface diffusion region 11 is formed in the semiconductor substrate so as to extend outwards from beneath the outer edge of the oxide layer 3. It will be seen that the ring 4 overlaps the junction between the diffused region 11 and the substrate 1 at the substrate surface, and that the metal layer 5 overlaps the junction between the junction between the region 9 and the substrate 1 at the substrate surface. An insulating layer 12 of undensified dielectric is formed over the aluminum ring 4 and over all of the upper surface of the device except for peripheral grid line area and the areas of the layers 5 and 6 which define the bond pad areas 7 and 8. (The layer 12 is not shown in FIG. 1.) This dielectric layer 12 cannot be densified as this would require temperatures which could not be withstood by the aluminum ring 4.

When electrical connections are made to the device by depositing bonds on the surface of the contact regions in the areas generally represented by circles 7 and 8, the bonds can be misaligned and as a result overlie the dielectric layer 12 and the underlying aluminium ring 4. As the dielectric layer 12 is not densified permanent or intermittent short circuits can be established through the dielectric layer 12 resulting in device failure or reliability problems.

Referring to FIG. 4, this illustrates a guard ring structure according to the present invention. The same reference numerals are used in FIGS. 3 and 4 where appropriate. It will be noted that in FIG. 4 the aluminium ring 4 which overlaps the outer edge of the oxide layer 3 has been replaced by a polysilicon ring 13 which in the illustrated case does not overlap the outer edge of the oxide layer 3. In an alternative arrangement however the polysilicon ring 13 could overlap the outer edge of the oxide layer 3. The polysilicon ring 13 is covered by a thick dielectric layer 14 which had been densified. This is possible because the polysilicon ring 13 can withstand much higher temperatures than the aluminium ring 4 of FIG. 3. Accordingly, a bond deposited on the dielectric layer 14 of FIG. 4 will not damage the dielectric layer and will not therefore cause an electrical short circuit between the bond and the polysilicon ring 13.

With the structure of FIG. 4 it is necessary to make an electrical connection between the guard region 11 and the polysilicon ring 13. This could be achieved by causing the polysilicon ring 13 to overlap the outer edge of the oxide layer 13, but in the illustrated case this connection is achieved by providing connection structures as illustrated in FIG. 5 at each of the four corners of the device.

Referring to FIG. 5, again the same reference numerals are used as in FIGS. 3 and 4 where appropriate. Instead of the polysilicon ring 13 being covered by a dielectric layer 14 as shown in FIG. 4 however, at the corners of the device the polysilicon ring 13 is covered by an aluminium layer 15. The aluminium layer 15 may be provided at any points on the device sufficiently far removed from the intended position of bond pads as to ensure that any misalignment of a bond pad will not cause a short circuit between the bond pad and the polysilicon ring. An undensified layer (not shown) corresponding to the layer 12 shown in FIG. 3 may also be placed over all the device except for the bond pad areas 7 and 8.

Referring now to FIGS. 6 to 16, successive steps in a process capable of producing a guard ring structure in accordance with the present invention will be described.

Referring to FIG. 6, a silicon substrate 16 (or a silicon epitaxial layer of the same or opposite polarity as and grown on the substrate) has an oxide layer formed upon it which is selectively etched to leave an annular oxide structure 17 which will define the edge of the device.

FIG. 7 illustrates the diffusion of a base dopant into the exposed surface 18 of the substrate to form a base region 19 which is of the opposite conductivity type to the silicon substrate the body of which forms a collector region 20. The same dopant is introduced on the outside of the oxide structure 17.

FIG. 8 shows the structure of FIG. 7 after a polysilicon layer 21 has been deposited. FIG. 8 also indicates by arrow 22 the position of a centre line about which the illustrated structure is symmetrical. The same arrow 22 is used in subsequent drawings some of which are drawn to a different scale as compared with FIG. 8.

FIG. 9 illustrates the deposition of a ring shaped resist structure 23, the ring structure defining an aperture which in the illustrated example is aligned with the centre line 22. In addition, annular resist structures 24 and 25 are formed on the polysilicon above the oxide structures 17. The position of the resist structures 23, 24 and 25 define the positions of the self aligned edges of the emitter and contact regions and guard rings.

FIG. 10 illustrates the structure of FIG. 9 after the polysilicon not covered by the resist structures 23, 24 and 25 has been etched away without etching away the underlying oxide layer. As a result a ring of polysilicon 26 is formed centrally with annular polysilicon structures 27 and 28 being formed around the periphery of the base region 19.

Referring to FIG. 11, a body of resist 29 is deposited so as to block the central aperture defined by the polysilicon ring 26. The alignment of the resist body 29 with the centre line is not critical. All that is required is that the body of resist 29 fully covers the aperture defined in the polysilicon 26 so as to prevent a subsequent processing step having any effect on the structure underlying the aperture in the polysilicon 26. A further body of resist 30 is formed over the polysilicon 27 and 28, the resist body 30 being arranged to fully cover the gap between the polysilicon structures 27 and 28. A radially inner edge 31 of the body of resist 30 overlies peripheral portions of the base region 19.

Referring to FIG. 12, the structure of FIG. 11 is etched to remove all those portions of the oxide layer which are not covered either by the polysilicon or the resist bodies 29 and 30. As a result the base region 19 is exposed between the resist edge 31 and an outer edge 32 of the polysilicon body 26.

As shown in FIG. 13, an emitter region 33 is diffused or implanted into the exposed base region defined between the edges 31 and 32 and a guard ring 34 is diffused or implanted into the substrate which is radially outside the polysilicon body 28. The emitter is driven in and the structure is covered with oxide (or any other suitable dielectric) to form an oxide layer 35.

Referring to FIG. 14, an annular body of resist 36 generally aligned with the polysilicon ring 26 is deposited over the oxide layer 35. Misalignments between the resist body 36 and the polysilicon 26 are not a problem providing the inner edge 37 of the resist is between the inner or outer edges of the polysilicon ring 26 and the outer edge 38 of the resist is outside the outer edge of the polysilicon ring 26. A resist body 39 is also formed over the polysilicon bodies 27 and 28, the resist body 39 defining apertures 40 preferably only in small areas, e.g. corners of the device. The outer edge 41 of the resist body 39 is radially inside the outer edge of the polysilicon body 28.

FIG. 15 illustrates the structure after oxide not protected by the resist bodies 36 and 39 has been etched away to expose a base contact region 42, a field plate contact region 43 and a collector field relief electrode contact region 44. In FIG. 15 the structure is shown after removal of the resist bodies 36 and 39.

FIG. 16 illustrates the final structure after deposition of a metal body 45 to form a base contact, a metal body 46 to define an emitter contact and a metal short to the collector base field plate (polysilicon), and a metal body 47 to define a metal short for the equipotential ring (polysilicon). The metal body 47 interconnects the equipotential ring defined by the polysilicon 28 to the guard ring 34. Metal bodies 47 are provided only at the corners of the device. Portions of the polysilicon equipotential ring 28 which are not contacted by the metal bodies 47 are covered with a densified thick dielectric layer (not shown) applied over the polysilicon 28 except at the corners of the device before formation of the metal bodies 47. The thick densified dielectric layer is able to withstand damage caused by misplaced bonds.

What is claimed is:

1. A bipolar semiconductor device guard structure, comprising a guard region formed in a substrate of the device and extending adjacent a peripheral portion of the device, an insulating layer formed on the substrate between the peripheral portion of the device and the guard region, a polysilicon layer formed on the insulating layer, a layer of densified dielectric covering the polysilicon layer, and at least one electrical interconnection between the polysilicon layer and the guard region.

2. A guard structure according to claim 1, wherein the polysilicon layer overlaps an outer edge of the insulating layer.

3. A guard structure according to claim 1, wherein the guard region is diffused or implanted into the substrate.

4. A guard structure according to claim 1, wherein the polysilicon layer defines at least part of a closed ring of electrically conductive material extending around the periphery of the substrate.

5. A guard structure according to claim 4, wherein the ring is rectangular, and four electrical interconnections are provided, one at each corner of the device.

6. A guard structure according to claim 1, wherein the at least one electrical interconnection is formed of metal.

7. A guard structure according to claim 6, wherein the metal is aluminium.

8. A guard structure according to claim 1, wherein the insulating layer is formed of silicon dioxide.

* * * * *